(12) United States Patent
Takizawa et al.

(10) Patent No.: US 11,127,476 B2
(45) Date of Patent: Sep. 21, 2021

(54) MEMORY SYSTEM CONTROLLING A THRESHOLD VOLTAGE IN A READ OPERATION AND METHOD

(71) Applicant: Kioxia Corporation, Minato-ku (JP)

(72) Inventors: Kazutaka Takizawa, Yokohama (JP); Yoshihisa Kojima, Kawasaki (JP); Sumio Kuroda, Yokohama (JP); Masaaki Niijima, Machida (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/817,371

(22) Filed: Mar. 12, 2020

(65) Prior Publication Data
US 2021/0082528 A1 Mar. 18, 2021

(30) Foreign Application Priority Data
Sep. 13, 2019 (JP) .............................. JP2019-166885

(51) Int. Cl.
*G11C 16/34* (2006.01)
*G11C 29/44* (2006.01)
*G11C 16/14* (2006.01)
*G11C 16/12* (2006.01)
*G11C 16/26* (2006.01)

(52) U.S. Cl.
CPC ............ *G11C 16/349* (2013.01); *G11C 16/12* (2013.01); *G11C 16/14* (2013.01); *G11C 16/26* (2013.01); *G11C 16/3431* (2013.01); *G11C 16/3477* (2013.01); *G11C 29/44* (2013.01)

(58) Field of Classification Search
CPC ....... G11C 16/349; G11C 16/12; G11C 16/14; G11C 16/26; G11C 16/3431; G11C 16/3477; G11C 29/44
See application file for complete search history.

(56) References Cited

U.S. PATENT DOCUMENTS

| | | | |
|---|---|---|---|
| 8,072,805 B2 * | 12/2011 | Chou .................... | G11C 16/34 365/185.03 |
| 8,929,140 B2 | 1/2015 | Nagashima | |
| 9,070,481 B1 * | 6/2015 | Ellis .................... | G06F 11/3409 |
| 9,799,405 B1 | 10/2017 | Micheloni et al. | |

(Continued)

FOREIGN PATENT DOCUMENTS

| | | |
|---|---|---|
| JP | 5349256 B2 | 11/2013 |
| JP | 2018-156696 A | 10/2018 |
| JP | 2018-163715 A | 10/2018 |

*Primary Examiner* — Vanthu T Nguyen
(74) *Attorney, Agent, or Firm* — Oblon, McClelland, Maier & Neustadt, L.L.P.

(57) ABSTRACT

According to one embodiment, a memory system includes a first memory and a memory controller. The first memory is nonvolatile and includes a plurality of memory cell transistors, each of which stores data corresponding to a threshold voltage. The memory controller causes the first memory to execute a read operation to acquire data corresponding to the threshold voltage from the plurality of memory cell transistors on the basis of a result of comparison between the threshold voltage and a read voltage. The memory controller selects a first candidate value from among a plurality of candidate values for the read voltage in accordance with a degree of stress that affects the threshold voltage; and causes the first memory to execute the read operation using the first candidate value as the read voltage.

14 Claims, 15 Drawing Sheets

(56) References Cited

U.S. PATENT DOCUMENTS

| | | |
|---|---|---|
| 9,812,215 B2 | 11/2017 | Takizawa et al. |
| 2012/0173920 A1* | 7/2012 | Park .................. G11C 29/82 |
| | | 714/6.11 |
| 2018/0268891 A1 | 9/2018 | Li et al. |
| 2018/0277173 A1 | 9/2018 | Takizawa et al. |
| 2020/0301602 A1* | 9/2020 | Kurosawa ............ G06F 3/0679 |

* cited by examiner

FIG.13

| INDEX | #1 | #2 | #3 | #4 | ... | #N |
|---|---|---|---|---|---|---|
| SHIFT AMOUNT A | | | | | | |
| ⋮ | | | | | | |
| SHIFT AMOUNT G | | | | | | |
| DETERMINATION REFERENCE VALUE (RETENTION TIME) | | | | | ... | |
| DETERMINATION REFERENCE VALUE (CROSSING TEMPERATURE) | | | | | | |
| DETERMINATION REFERENCE VALUE (NUMBER OF FRAMES (FBC > Cth)) | | | | | | |

209a

MEMORY SYSTEM CONTROLLING A THRESHOLD VOLTAGE IN A READ OPERATION AND METHOD

CROSS-REFERENCE TO RELATED APPLICATIONS

This application is based upon and claims the benefit of priority from Japanese Patent Application No. 2019-166885, filed on Sep. 13, 2019; the entire contents of which are incorporated herein by reference.

FIELD

Embodiments described herein relate generally to a memory system and a method.

BACKGROUND

Memory systems including nonvolatile memory cell transistors (memory cells) are known. In read operation, such a memory system compares a threshold voltage of a memory cell and a read voltage to determine data stored in the memory cell in accordance with a result of the comparison.

The threshold voltage of the memory cell is variable due to various factors. The memory system is configured to be able to adjust the read voltage to obtain correct data from the memory cell even when the threshold voltage of the memory cell varies.

BRIEF DESCRIPTION OF THE DRAWINGS

FIG. 13 is a schematic diagram illustrating an exemplary data structure of a shift index table in a second embodiment;

DETAILED DESCRIPTION

According to one embodiment of this disclosure, a memory system includes a first memory and a memory controller. The first memory is nonvolatile and includes a plurality of memory cell transistors, each of which stores data corresponding to a threshold voltage. The memory controller causes the first memory to execute a read operation to acquire data corresponding to the threshold voltage from the plurality of memory cell transistors on the basis of a result of comparison between the threshold voltage and a read voltage. The memory controller selects a first candidate value from among a plurality of candidate values for the read voltage in accordance with a degree of stress that affects the threshold voltage; and causes the first memory to execute the read operation using the first candidate value as the read voltage.

Hereinafter, a memory system and a method according to embodiments will be described in detail with reference to the accompanying drawings. The following embodiments are merely exemplary and are unintended to limit the scope of the present invention.

First Embodiment

Figure 1:
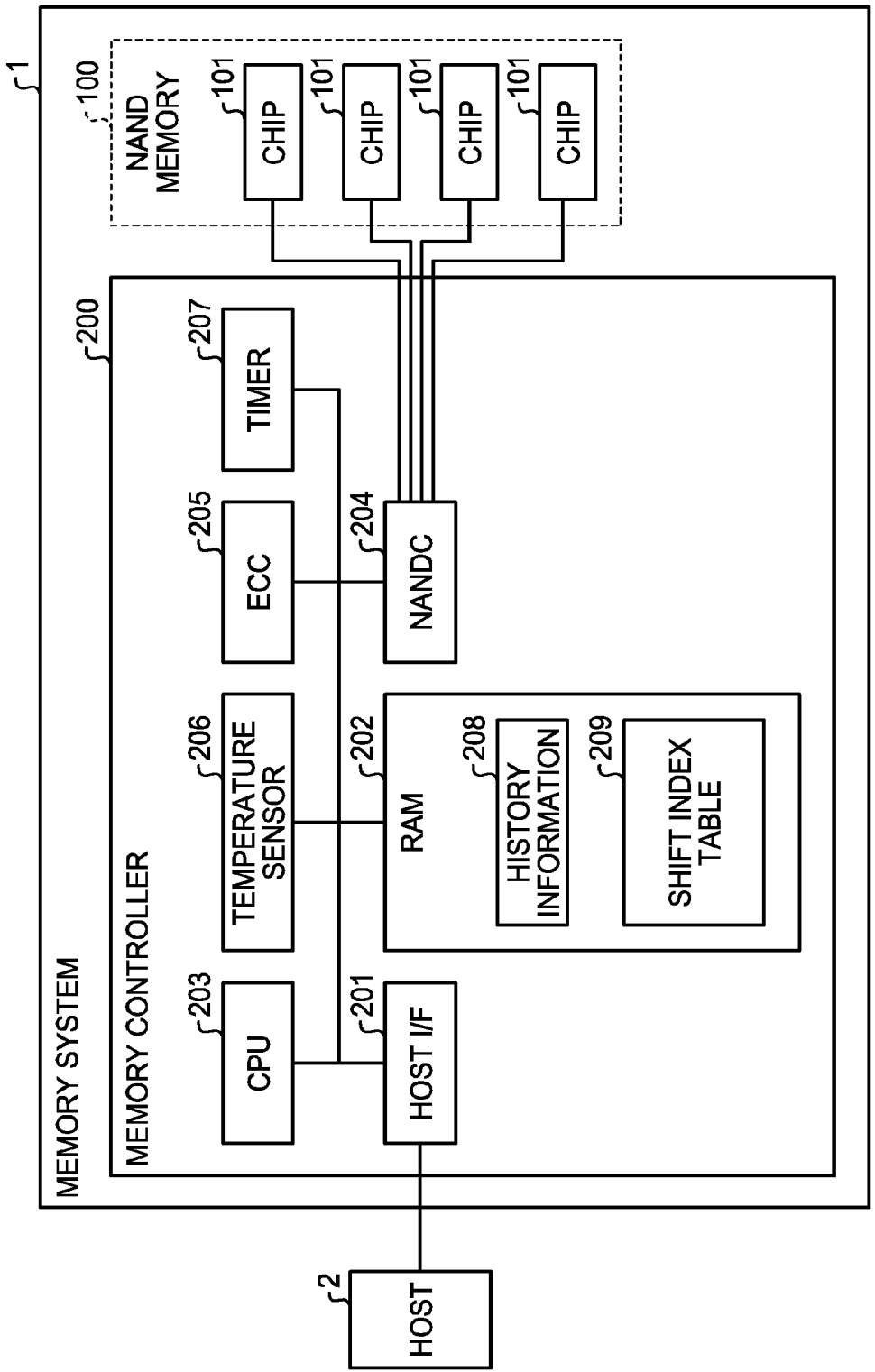
FIG. 1 is a schematic diagram illustrating an exemplary configuration of a memory system according to a first embodiment.

FIG. 1 is a schematic diagram illustrating an exemplary configuration of a memory system according to a first embodiment. The memory system 1 is connectable to a host 2. The host 2 represents, for example, a personal computer, a portable information terminal, or a server.

The memory system 1 can receive access requests, that is, read requests and write requests, from the host 2.

The memory system 1 includes a NAND flash memory (NAND memory) 100 and a memory controller 200 that executes data transfer between the host 2 and the NAND memory 100.

The NAND memory 100 includes one or more memory chips 101. Herein, the NAND memory 100 includes four memory chips 101 as an example.

The memory controller 200 includes a host interface (I/F) 201, a random access memory (RAM) 202, a central processing unit (CPU) 203, a NAND controller (NANDC) 204, an error correction circuit (ECC) 205, a temperature sensor 206, and a timer 207.

The memory controller 200 can be configured with a system-on-a-chip (SoC), for example. The memory controller 200 may include a plurality of chips. The memory controller 200 may include a field-programmable gate array (FPGA) or an application specific integrated circuit (ASIC). The functions of the memory controller 200 may be implemented by software, hardware, or a combination thereof. The RAM 202 may be disposed outside the memory controller 200.

The RAM 202 serves as a buffer or a work area for the CPU 203. The memory serving as the RAM 202 is not limited to a specific type. For example, the RAM 202 may include a dynamic random access memory (DRAM), a static random access memory (SRAM), or a combination thereof.

In the first embodiment, the RAM 202 stores history information 208 and a shift index table 209, which will be described later in detail.

The host interface 201 controls a communication interface with respect to the host 2. The host interface 201 transfers data between the host 2 and the RAM 202 under the control of the CPU 203. The NANDC 204 transfers data between the NAND memory 100 and the RAM 202 under the control of the CPU 203.

The CPU 203 controls the host interface 201, the RAM 202, the NANDC 204, the ECC 205, the temperature sensor 206, and the timer 207. The CPU 203 controls each element by executing a firmware program.

The ECC 205 encodes data to be written to the NAND memory 100. Encoding is implemented using an error correction code. The ECC 205 decodes data read from the NAND memory 100 to detect and correct a bit error in the data.

An encoding method used by the ECC 205 is not limited to a specific method. As one example, low density parity check (LDPC) may be used as an encoding method.

The temperature sensor 206 outputs a value corresponding to a temperature of the memory system 1. The temperature sensor 206 may be located outside the memory controller 200. The temperature sensor 206 may be incorporated in each of part of the four memory chips 101 or in each of all of the four memory chips 101. The temperature sensor 206 may be mounted in the vicinity of each of part of the four memory chips 101 or in the vicinity of each of all of the four memory chips 101. The number of temperature sensors 206 included in the memory system 1 is not limited to one.

The timer 207 measures time. The timer 207 may be omissible, and the CPU 203 may measure time instead.

Figure 2:
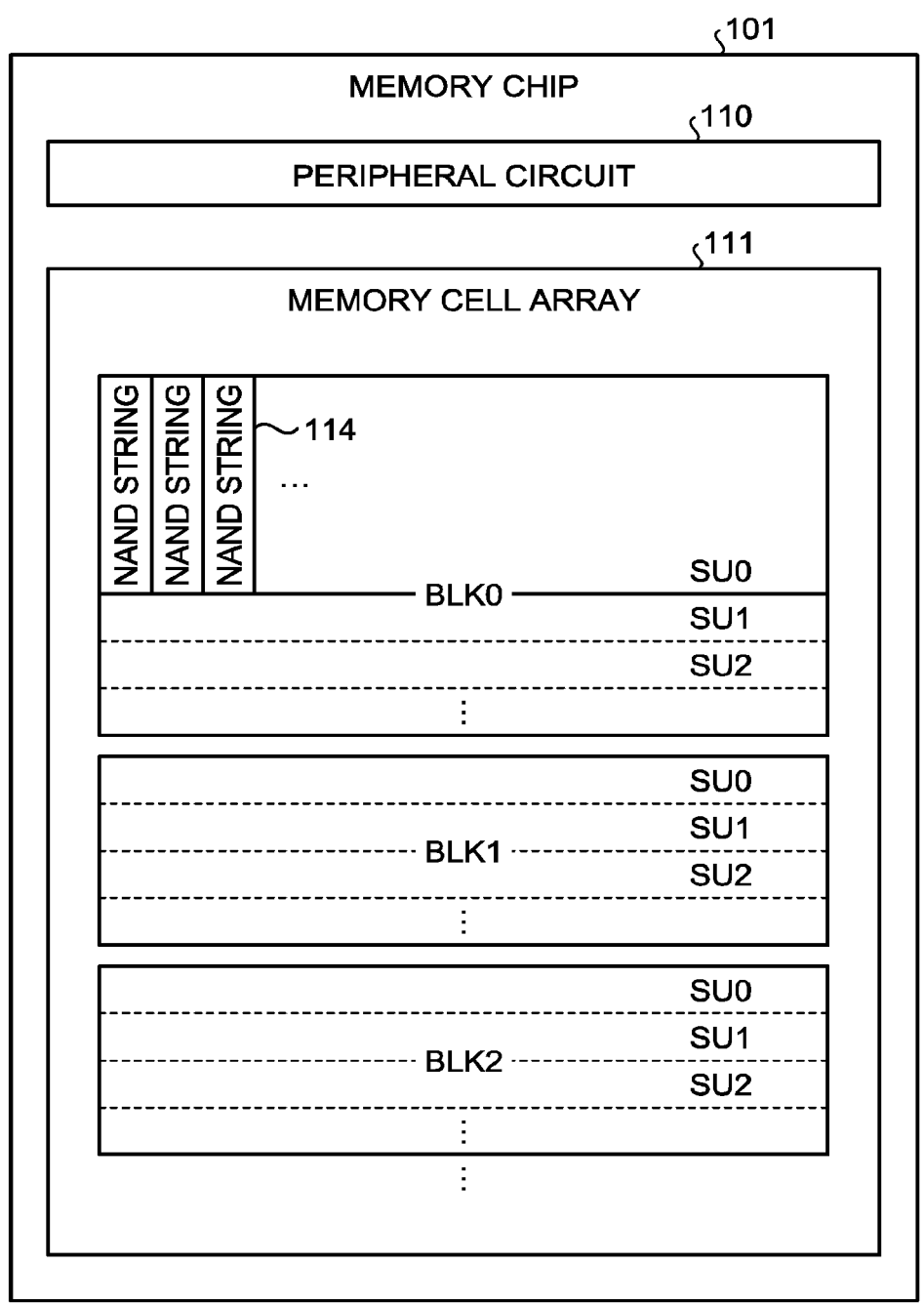
FIG. 2 is a schematic diagram illustrating an exemplary configuration of a memory chip according to the first embodiment.

FIG. 2 is a schematic diagram illustrating an exemplary configuration of a memory chip 101 according to the first embodiment. As illustrated, the memory chip 101 includes a peripheral circuit 110 and a memory cell array 111.

The memory cell array 111 includes a plurality of blocks BLK (BLK0, BLK1, . . . ), each of which is a group of nonvolatile memory cell transistors. Each of the blocks BLK includes a plurality of string units SU (SU0, SU1, . . . ) each of which is a group of memory cell transistors associated with word lines and bit lines. Each of the string units SU includes a plurality of NAND strings 114 that includes memory cell transistors connected in series. Any number of NAND strings 114 may be included in the string unit SU.

The peripheral circuit 110 includes, for example, a row decoder, a column decoder, a sense amplifier, a latch circuit, and a voltage generator circuit. In response to receipt of a command from the memory controller 200, the peripheral circuit 110 executes any of a program operation, a read operation, and an erase operation to the memory cell array 111.

Figure 3:
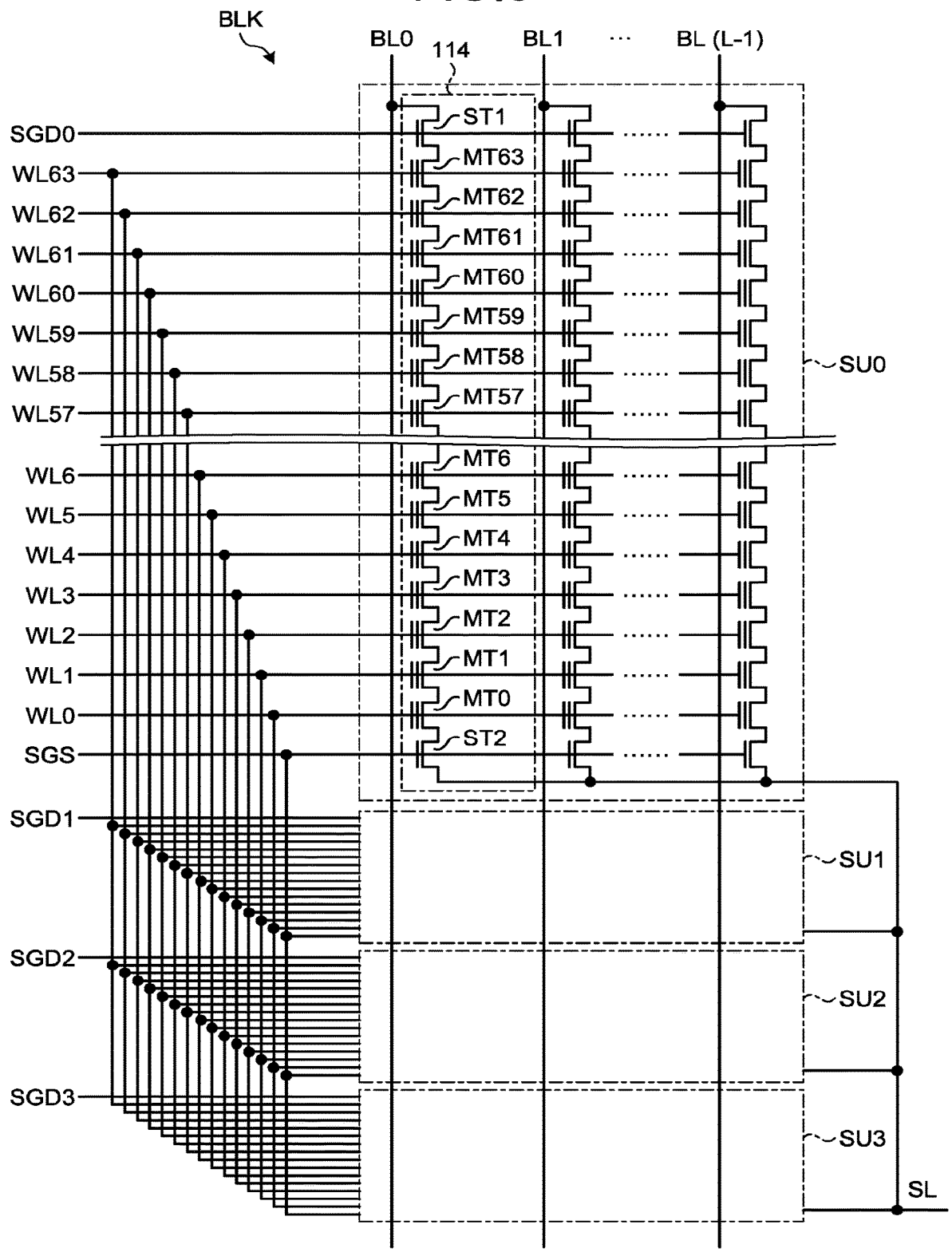
FIG. 3 is a schematic diagram illustrating a circuit configuration of a block BLK according to the first embodiment.

FIG. 3 is a schematic diagram illustrating a circuit configuration of a block BLK according to the first embodiment. The configuration of each block BLK is identical. The block BLK includes, for example, four string units SU0 to SU3. Each string unit SU includes the plurality of NAND strings 114.

Each of the NAND strings 114 includes, for example, 64 memory cell transistors MT (MT0 to MT63) and selection transistors ST1 and ST2. The memory cell transistors MT each include a control gate and a charge storage layer, and stores data in a nonvolatile manner. The 64 memory cell transistors MT (MT0 to MT63) are connected in series between the source of the selection transistor ST1 and the drain of the selection transistor ST2. The memory cell transistor MT may be of a MONOS type that includes an insulating film as the charge storage layer or of an FG type that includes a conductive film as the charge storage layer.

The number of memory cell transistors MT in the NAND string 114 is not limited to 64.

The gates of the selection transistors ST1 in the respective string units SU0 to SU3 are connected to selection gate lines SGD0 to SGD3, respectively. The gates of the selection transistors ST2 in the respective string units SU0 to SU3 are connected in common to, for example, a selection gate line SGS. The gates of the selection transistors ST2 in the respective string units SU0 to SU3 may be connected to different selection gate lines from one another. The control gates of the memory cell transistors MT0 to MT63 in the same block BLK are connected in common to word lines WL0 to WL63, respectively.

The drains of the selection transistors ST1 of the respective NAND strings 114 in the string unit SU are connected to different bit lines BL (BL0 to BL(L−1) where L is a natural number of 2 or more). The bit lines BL serve to commonly connect one NAND string 114 in each string unit SU between two or more blocks BLK. The sources of the respective selection transistors ST2 are connected in common to a source line SL.

That is, each string unit SU includes a set of NAND strings 114 connected to different bit lines BL and the same selection gate line SGD. The block BLK includes a set of string units SU sharing the word lines WL. The memory cell array 111 includes a set of blocks BLK sharing the bit lines BL.

The peripheral circuit 110 can collectively execute program operation and read operation to the memory cell transistors MT connected to one word line WL in one string unit SU. A set of data to be subjected to a program operation or a read operation through one word line WL in one string unit SU is referred to as a page.

The peripheral circuit 110 executes an erase operation in units of block BLK. That is, all the data stored in one block BLK is erased together.

Figure 4:
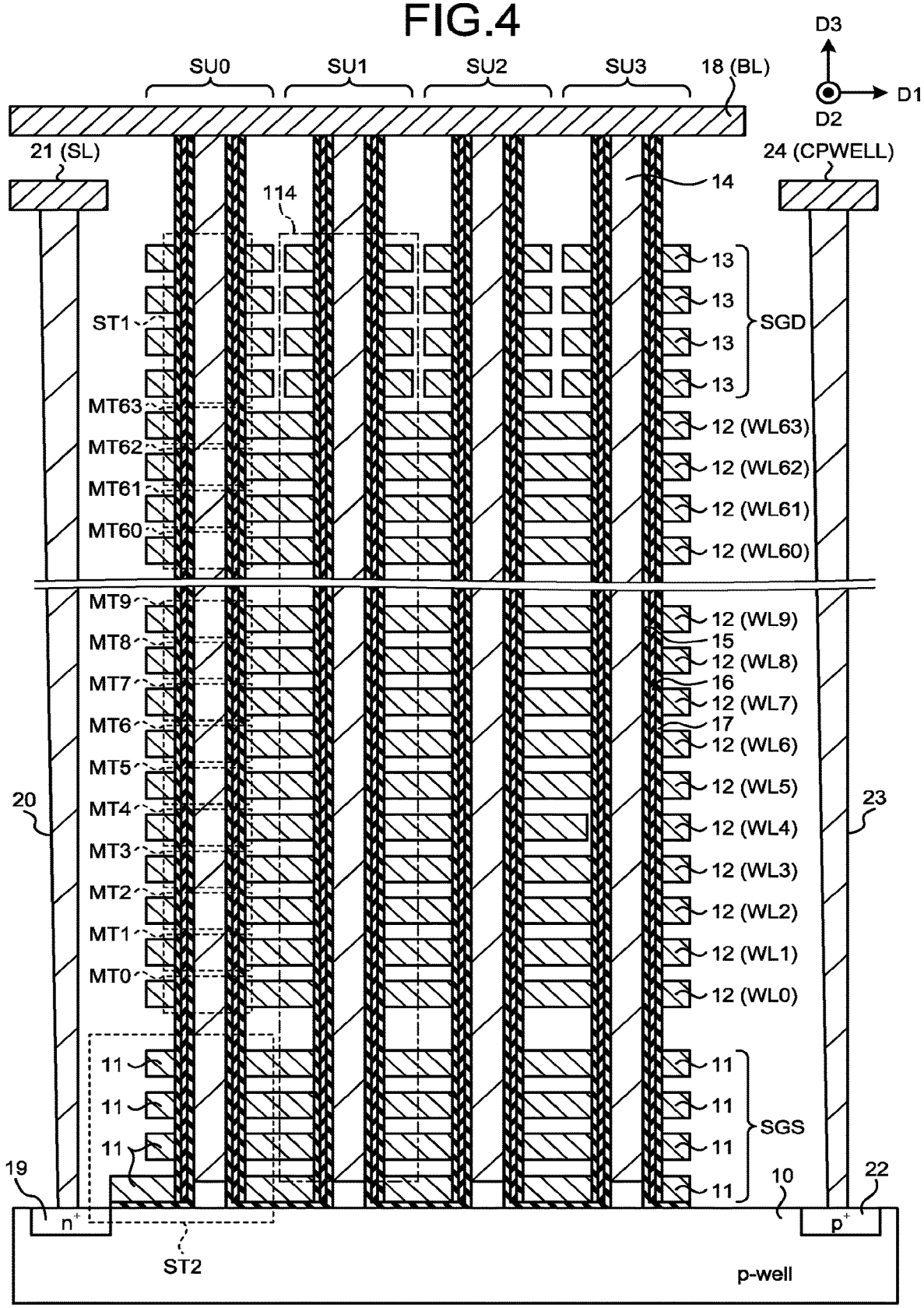
FIG. 4 is a cross-sectional view of a partial region of the block BLK in the first embodiment.

FIG. 4 is a cross-sectional view of a partial region of the block BLK in the first embodiment. As illustrated in FIG. 4, a plurality of NAND strings 114 is located on a p-well region (semiconductor substrate) 10. That is, on the well region 10, four wiring layers 11 functioning as the selection gate lines SGS, sixty-four wiring layers 12 functioning as the word lines WL0 to WL63, and four wiring layers 13 functioning as the selection gate lines SGD are laminated sequentially, for example. An insulating film (not illustrated) is located between every two wiring layers.

A conductor 14 of a pillar form extends to the well region 10 through the wiring layers 13, 12, and 11. A gate insulating film 15, a charge storage layer (insulating film or conductive film) 16, and a block insulating film 17 are laminated in sequence on a side surface of the conductor 14, forming the memory cell transistors MT and the selection transistors ST1 and ST2. The conductor 14 functions as a current path of the NAND string 114 and as a region where channels of the transistors are formed. The top end of the conductor 14 is connected to a metal wiring layer 18 functioning as the bit line BL.

A surface region of the well region 10 includes an n+ type impurity diffusion layer 19. On the diffusion layer 19, a contact plug 20 is connected to a metal wiring layer 21 functioning as the source line SL. The surface region of the well region 10 further includes a p+ type impurity diffusion layer 22. On the diffusion layer 22, a contact plug 23 is connected to a metal wiring layer 24 functioning as well wiring CPWELL. The well wiring CPWELL serves to apply a voltage to the conductor 14 through the well region 10.

Same elements as above are arrayed on the semiconductor substrate in a second direction D2 parallel to the semiconductor substrate, and the sets of NAND strings 114 arrayed in the second direction D2 constitute the string units SU.

The configurations illustrated in FIGS. 2 to 4 are merely exemplary. The configuration of the memory cell array 111 is not limited to such an example. The memory cell array 111 may include, for example, two-dimensionally arranged NAND strings 114.

Hereinafter, the memory cell transistor MT is referred to as a memory cell.

Figure 5:
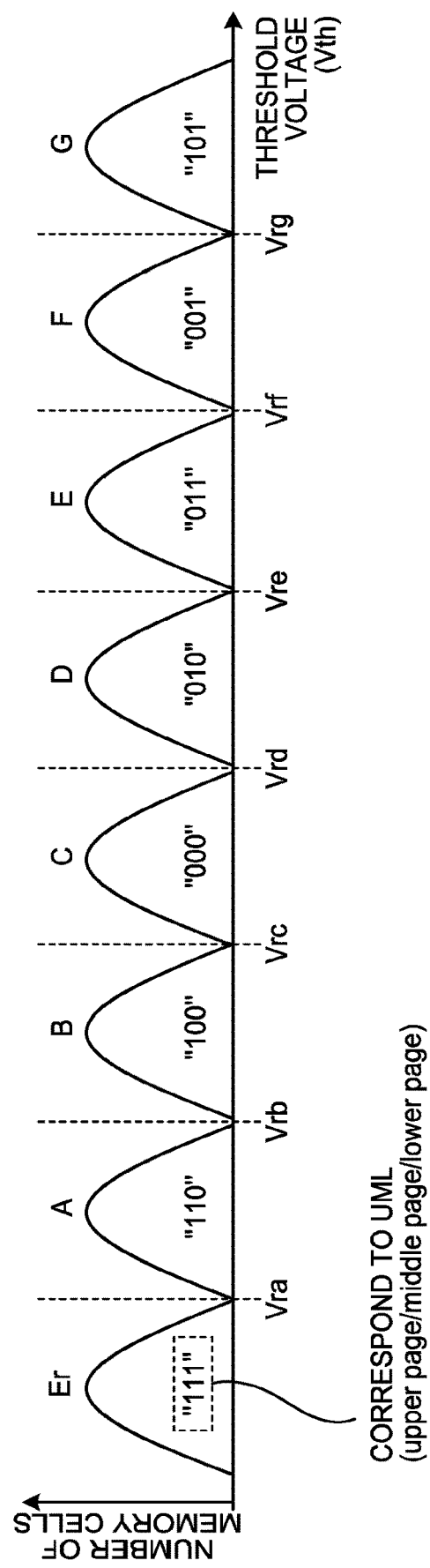
FIG. 5 is a schematic diagram illustrating an exemplary threshold voltage distribution that a memory cell may exhibit in the first embodiment.

FIG. 5 is a schematic diagram illustrating an exemplary threshold voltage distribution that the memory cells may exhibit in the first embodiment. In the graph in FIG. 5, the vertical axis indicates the number of memory cells, and the horizontal axis indicates threshold voltage (Vth). A triple level cell (TLC) is adopted for storing data in each memory cell as an example. By TLC, each memory cell can store 3-bit data.

According to TLC, the range of the threshold voltage values is divisible into eight sections. The eight divided sections are referred to as an Er-state, an A-state, a B-state, a C-state, a D-state, an E-state, an F-state, and a G-state in the order from a lowest threshold voltage. In a program operation, the peripheral circuit 110 controls the threshold voltage of each memory cell to be in any of the Er-state, the A-state, the B-state, the C-state, the D-state, the E-state, the F-state, and the G-state.

As a result, when the number of memory cells relative to the threshold voltage is plotted, the threshold voltage distribution of the memory cells ideally exhibits eight lobes of different states, as illustrated in FIG. 5.

Each of the eight states corresponds to different 3-bit data. As an example, the Er-state corresponds to "111", the A-state corresponds to "110", the B-state corresponds to "100", the C-state corresponds to "000", the D-state corresponds to "010", the E-state corresponds to "011", the F-state corresponds to "001", and the G-state corresponds to "101". Thus, each memory cell can store data corresponding to the state of the threshold voltage.

As an example, of 3-bit data stored in one memory cell, the first digit can be referred to as an upper bit, the middle digit can be referred to as a middle bit, and the last digit can be referred to as a lower bit. A set of lower bits written to each word line may be referred to as a lower page. A set of middle bits written to each word line may be referred to as a middle page. A set of upper bits written to each word line may be referred to as an upper page. The digit names of the 3-bit data stored in one memory cell are not limited to such examples. The names of pages including the set of digits are not limited to such examples.

Through an erase operation, the threshold voltage is lowered to the Er-state. Through a program operation, the threshold voltage is maintained in the Er-state or raised to any of the A-state, the B-state, the C-state, the D-state, the E-state, the F-state, and the G-state.

The Er-state is also referred to as an erase state.

A data determination voltage is set at the boundary between every two adjacent states. This voltage is referred to as a read voltage.

As illustrated in FIG. 5, for example, a read voltage Vra is set between the Er-state and the A-state, a read voltage Vrb is set between the A-state and the B-state, a read voltage Vrc is set between the B-state and the C-state, a read voltage Vrd is set between the C-state and the D-state, a read voltage Vre is set between the D-state and the E-state, a read voltage Vrf is set between the E-state and the F-state, and a read voltage Vrg is set between the F-state and the G-state. That is, in a TLC mode that defines eight states, the seven read voltages are set. In a read operation, the peripheral circuit 110 specifies the state of the memory cell by comparing each of the read voltages with the threshold voltage of the memory cell, and outputs data corresponding to the specified state.

In FIG. 5, the eight distributions of the memory cells do not overlap each other by way of example. However, the threshold voltage of the memory cell may vary due to various factors. Because of this, in executing the read operation actually, the distributions of the eight states may overlap each other.

Figure 6:
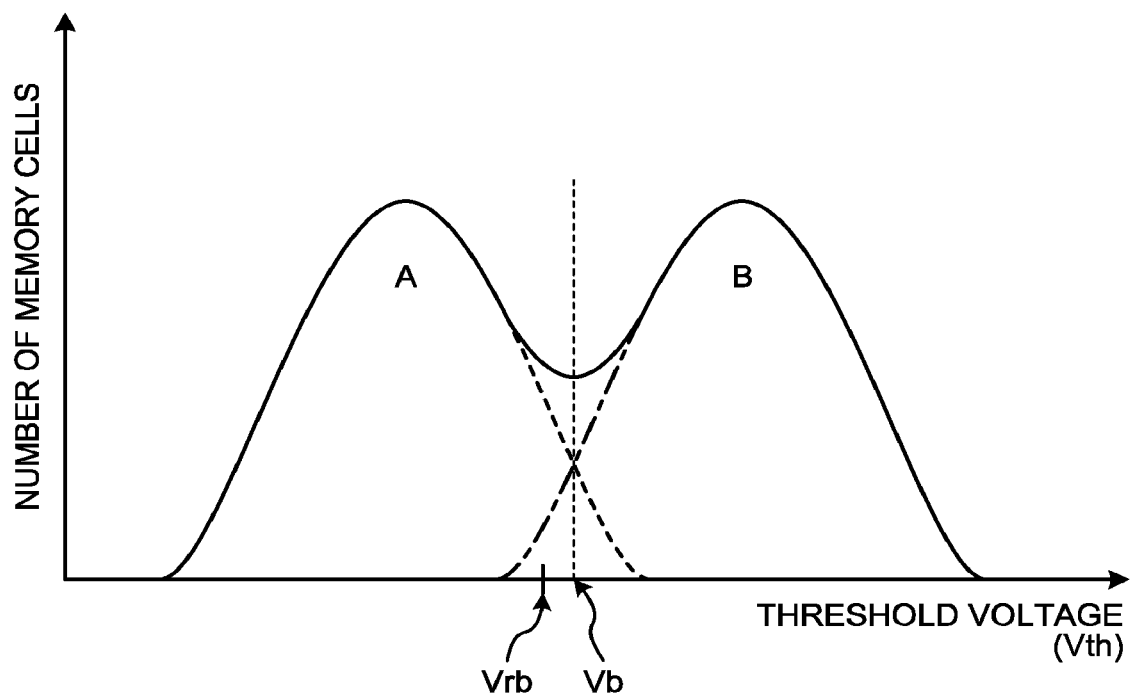
FIG. 6 is a schematic diagram illustrating another example of a threshold voltage distribution that the memory cell may exhibit in the first embodiment.

FIG. 6 is a schematic diagram illustrating another example of a threshold voltage distribution that the memory cells may exhibit in the first embodiment. For the sake of simple explanation, FIG. 6 depicts a distribution of the threshold voltage of memory cells in either the A-state or the B-state. The solid line indicates a distribution of the threshold voltage of memory cells in either the A-state or the B-state. The broken line indicates a distribution of the threshold voltage of memory cells in the A-state, and the alternate-long-and-short dash line indicates a distribution of the threshold voltage of memory cells in the B-state. In the example of FIG. 6, the bottom of the distribution of the threshold voltage of the memory cells of the A-state overlaps the bottom of the distribution of the threshold voltage of the memory cells of the B-state. In other words, a maximum value of the threshold voltages of the memory cells in the A-state exceeds the read voltage Vrb. A minimum value of the threshold voltages of the memory cells in the B-state is lower than the read voltage Vrb. In reading a memory cell in the A-state whose threshold voltage is higher than the read voltage Vrb, the memory cell is recognized as being in the B-state. That is, for example, data programmed as "110" is read as "100". In reading a memory cell of the B-state exhibiting a threshold voltage lower than the read voltage Vrb, the memory cell is recognized as being in the A-state. That is, data programmed as "100" is read as "110".

Thus, read data may vary in value from programmed data due to a variation in threshold voltage. The memory controller 200 deals with variations in data and threshold voltage by error correction and read voltage shift.

Specifically, the ECC 205 of the memory controller 200 performs error correction to read data. The ECC 205 might fail in error correction to data obtained by the read operation, which means a failure of the read operation. In such a case the memory controller 200 varies the read voltage for retrying the read operation. Herein, the retried read operation is referred to as a retry read operation. A failure of error correction signifies that the original data cannot be restored from the varied data. Specifically, a failure of error correction signifies that error bits in read data are uncorrectable. A success of error correction signifies that all the error bits in read data are corrected. The memory controller 200 repeatedly executes a retry read operation while varying the read voltage until it succeeds in the read operation, that is, until it succeeds in error correction to data obtained by the read operation.

The value of the read voltage may be represented by various amounts. The value of the read voltage may be instructed in various manners. In the present embodiment, as an example, a reference value is preset for each read voltage Vra to Vrg, and the value of the read voltage is represented by a shift amount being a difference from the reference value. In addition, the memory chip 101 stores the reference value for each read voltage in a given location. The memory controller 200 instructs the memory chip 101 about the shift amount from the reference value for each read voltage.

The representation and instruction of the read voltage are not limited thereto. For example, the read voltage value may be represented not by a difference but by a voltage value. The memory chip 101 may be instructed about the read voltage in the form of voltage value instead of the difference.

In the retry read operation, the memory controller 200 acquires the read voltage for use in the read operation, with reference to the shift index table 209.

Figure 7:
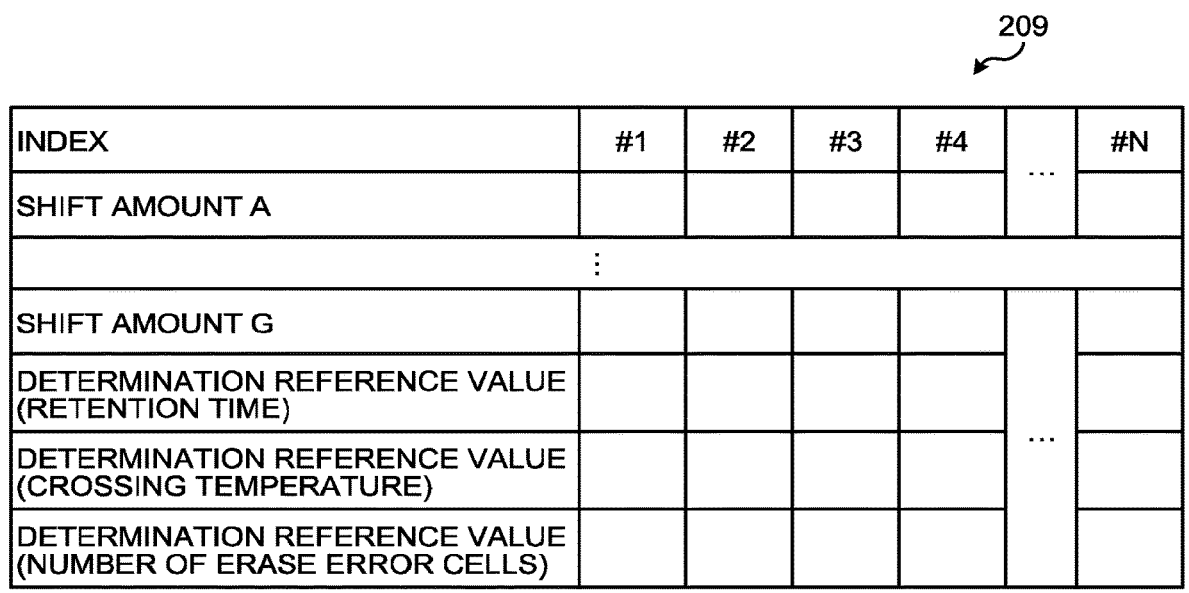
FIG. 7 is a schematic diagram illustrating an exemplary data structure of a shift index table in the first embodiment.

FIG. 7 is a schematic diagram illustrating an exemplary data structure of the shift index table 209 in the first embodiment. The shift index table 209 contains a plurality of shift patterns. The shift index table 209 lists one shift pattern in each column. Each of the shift patterns is a set of candidate values for all the read voltages (i.e., Vra, Vrb, Vrc, Vrd, Vre, Vrf, and Vrg). The candidate value for each read voltage included in each shift pattern is represented in the form of shift amount from the reference value. The shift amount X (where X represents A, B, C, D, E, F, and G) indicates the difference of the read voltage Vrx (where x represents a, b, c, d, e, f, and g) from the reference value.

In addition, the shift patterns are assigned with indexes #1 to #N. N represents an integer of two or more. At the time of repeatedly executing the retry read operation, shift patterns are selectable in the order of indexes.

There are certain events that might largely affect the variation in threshold voltage. Three typical events will be described below.

The first event is exemplified by data retention time. The data retention time represents an elapsed time after data is written by a program operation. The longer the elapsed time is, the larger the amount of variation of the threshold voltage exhibits.

The second event is exemplified by temperature crossing. The temperature crossing represents a difference in temperature of the memory cell array 111 between execution of a program operation and execution of a read operation.

The threshold voltage of each memory cell varies depending on temperature. Thus, with a difference in the temperature of the memory cell array 111 between execution of a program operation and execution of a read operation, the threshold voltage in the read operation increases or decreases with respect to that in the program operation in accordance with the temperature difference. Hereinafter, a difference in the temperature of the memory cell array 111 between the program operation and the read operation is referred to as crossing temperature.

The third event is such that a memory cell or memory cells remain data-erasure uncompleted after the erase operation, which will be described below in detail. Hereinafter, the data-erasure uncompleted memory cell, in other words, a memory cell whose threshold voltage is not in the Er-state after the erase operation is referred to as an erase-error cell. Also, incompletion of data erasure is referred to as an erase error.

Figure 8:
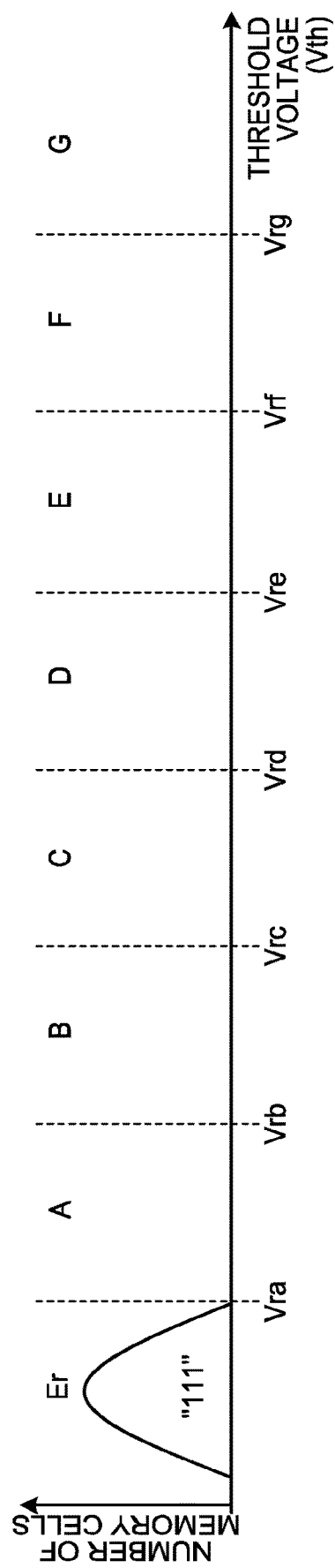
FIG. 8 is a schematic diagram illustrating a threshold voltage distribution when data is appropriately erased from all the memory cells.
Figure 9:
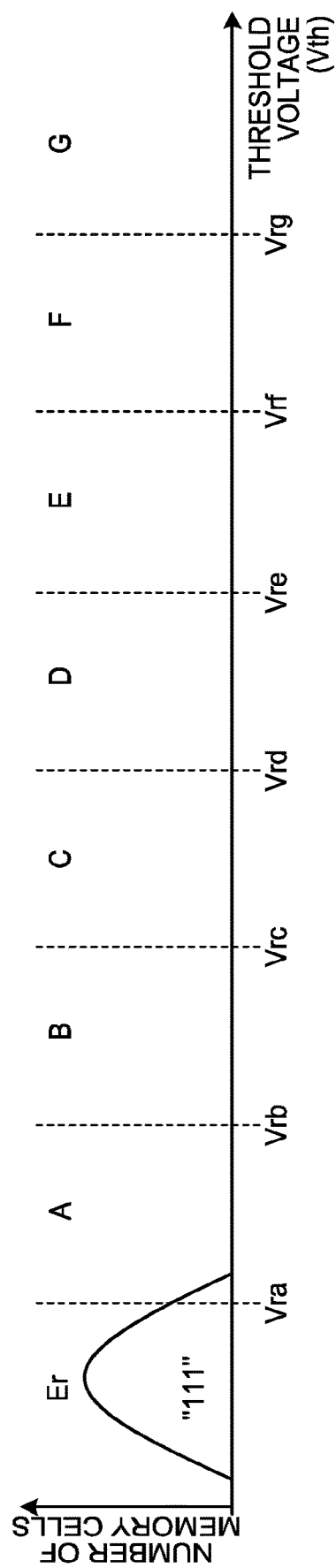
FIG. 9 is a schematic diagram illustrating a threshold voltage distribution when data erasure from part of the memory cells is not completed.

FIG. 8 and FIG. 9 are schematic diagrams illustrating an exemplary threshold voltage distribution after the erase operation to a certain block in the first embodiment.

FIG. 8 illustrates a threshold voltage distribution formed when data is appropriately erased from all the memory cells. As illustrated in FIG. 8, an entire lobe of the threshold voltage distribution is included in the Er-state when data is appropriately erased from all the memory cells.

FIG. 9 illustrates a threshold voltage distribution formed when data erasure from part of the memory cells is not completed. As illustrated in FIG. 9, part of the lobe of the threshold voltage distribution expands across the boundary between the Er-state and the A-state. In the case of incompletion of data erasure from the memory cells, the threshold voltage distribution after the erase operation is broader in range than that in the case of appropriate completion of data erasure from all the memory cells. After execution of the program operation to a block exhibiting such a broad threshold voltage distribution, the threshold voltage distribution of the block in question becomes broader in range than that of a block where data is appropriately erased from all the memory cells.

Because of this, through a program operation and a read operation to a block including a memory cell containing unerased data, data containing more error bits is read than data from a block where data is normally erased from all the memory cells, irrespective of read timing, e.g., even immediately after the program operation.

That is, when memory cells remain data-erasure uncompleted, the threshold voltage distribution will be offset from the ideal distribution. The degree of offset of the threshold voltage distribution from the ideal distribution increases as the number of memory cells from which data is not appropriately erased increases.

Such a erase-error cell may occur, for example, as follows. The peripheral circuit 110 applies a given voltage to the semiconductor substrate once or more, to concurrently lower the threshold voltages of all the memory cells, which are included in a target block to be subjected to an erase operation, to the Er-state. Upon each voltage application, the peripheral circuit 110 determines whether the threshold voltage of each memory cell of the target block lowers to a given verification level or below, for example, the read voltage Vra or below.

For example, the peripheral circuit 110 tests the bit line of the target block to find if the bit line is in a conductive state, by applying a verification-level voltage to all the word lines of the target block. After determining that the bit line is conductive, the peripheral circuit 110 determines that the threshold voltages of all the memory cells connected to the bit line are equal to or lower than the verification level.

Ideally, all the bit lines become conductive by applying voltages a less number of times. However, the number of voltage applications may increase for some reason. In such a case the erase operation is terminated when the number of conductive bit lines matches or exceeds a given value. This results in incompletion of data erasure from a memory cell or memory cells.

The three events described above may apply stress to the memory cells, causing great variation in the threshold voltage. These three events may more largely affect the threshold voltage in the future along with further miniatualization of memory cells.

In a case where a smaller variation in the threshold voltage, the shift patterns can be selected in the order of indexes upon each retry read operation, to be able to read data from the memory cells through a relatively small number of retry read operations without a failure of error correction. If threshold voltage varies due to the three events as above, however, a large number of retry read operations may need to be performed to the memory cells until an appropriate shift pattern, that is, a shift pattern for reading data without a failure of error correction, is found. That is, the time taken for obtaining data containing no error may be elongated.

In view of this, in the first embodiment, the memory controller 200 is configured to measure the degree of stress caused by the three events and select a shift pattern in accordance with the measured value. Numerical information to be measured as the degree of stress represents, for example, retention time, crossing temperature, and the number of erase-error cells. The numerical information to be measured as the degree of stress is not limited to such an example. One or two of the retention time, the crossing temperature, and the number of erase-error cells may be measured. Numerical information other than the retention time, the crossing temperature, and the number of erase-error cells may be measured. Hereinafter, the measured value of the degree of stress is referred to as a stress value.

To be able to select a shift pattern in accordance with the stress value, in the shift index table 209, determination reference values for the degree of stress are associated with part or all of the shift patterns. According to the example of FIG. 7, the shift patterns are each associated with determination reference values for retention time, crossing temperature, and the number of erase-error cells.

The CPU 203 calculates a divergence between the stress value and each determination reference value for each shift pattern. In a first retry read operation, the CPU 203 selects a shift pattern associated with a determination reference value having a smallest divergence from the stress value. In second and subsequent retry read operations, the CPU 203 selects a shift pattern associated with a determination reference value having a smallest divergence from the stress value except for the selected shift pattern. That is, the CPU 203 selects the shift patterns in the order of divergence starting from the one with the smallest divergence.

Thus, selecting the shift pattern according to the stress value makes it possible to decrease the number of executions of retry read operation in comparison with selecting the shift pattern in the order of indexes. This can shorten the time taken for obtaining error-free data, improving read performance.

Any calculation method of the divergence between the stress value and each determination reference value may be adopted. As an example, the total value of differences between the stress value and the determination reference values can be set as the divergence. The differences may be multiplied by a weighting coefficient.

Figure 10:
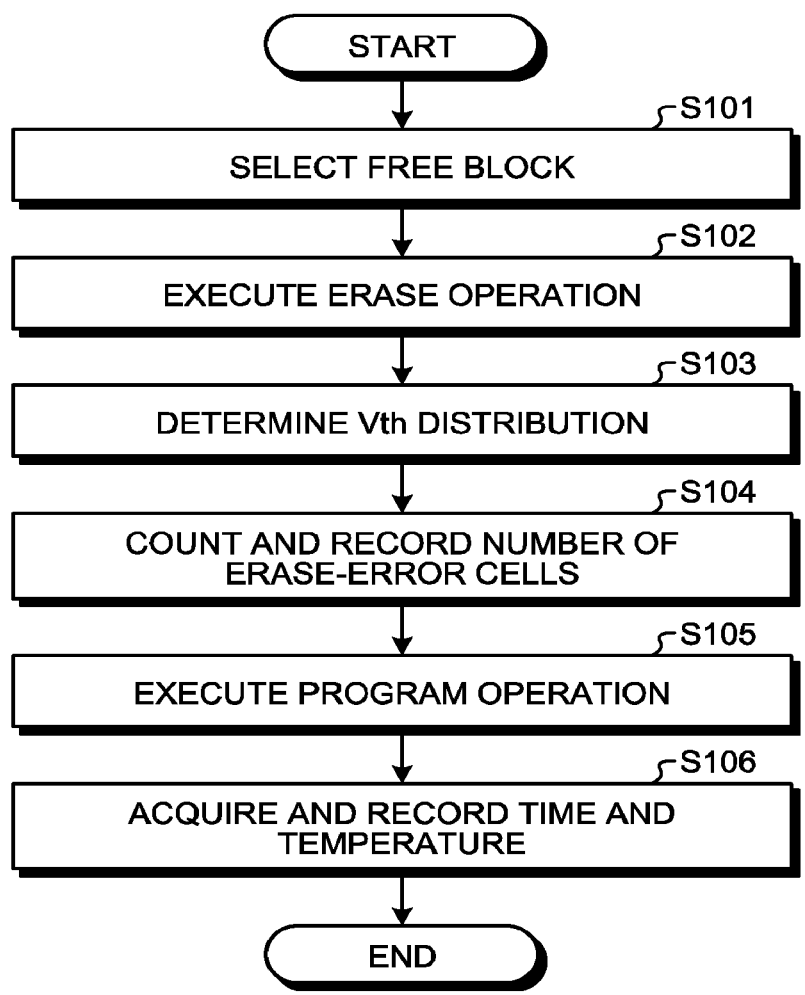
FIG. 10 is a flowchart illustrating an exemplary series of processes in program operation in the first embodiment.
Figure 11:
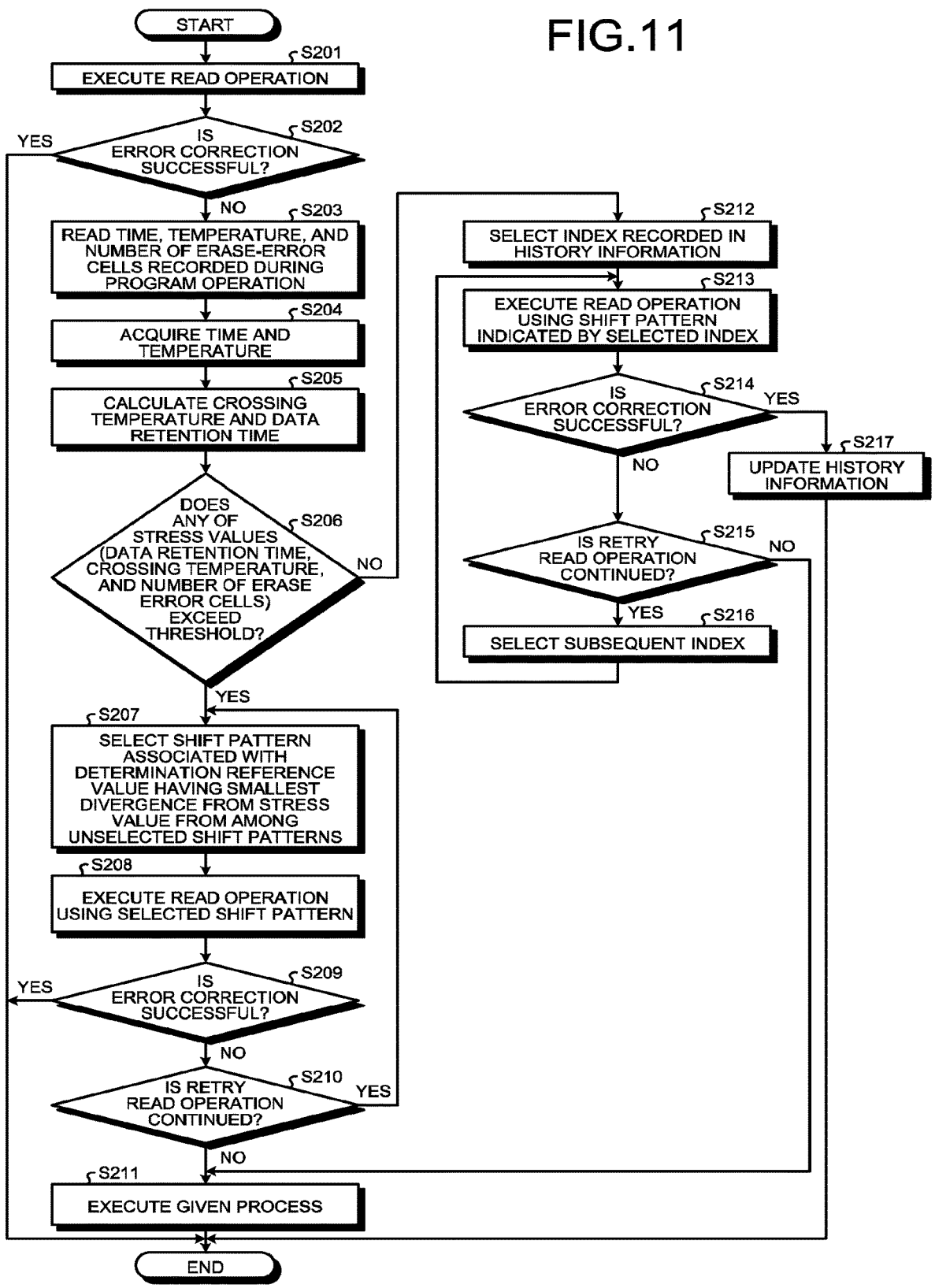
FIG. 11 is a flowchart illustrating an exemplary series of processes in read operation in the first embodiment.

With reference to FIG. 10 and FIG. 11, the operations of the memory system 1 in the first embodiment will be described. The operations illustrated in FIG. 10 and FIG. 11 are executed in units of block. The operations illustrated in FIG. 10 and FIG. 11 may be executed in units of storage area different from the block.

FIG. 10 is a flowchart illustrating an exemplary series of processes in the program operation in the first embodiment.

First, the memory controller 200 selects a free block (S101). The selected free block is referred to as a target block.

A free block refers to a block in which all the user data written is invalidated. The free block can be generated through garbage collection, for example. Garbage collection refers to transcribing valid data among data stored in a certain block (a first block) to another block (a second block) and regarding all the data stored in the first block as invalid. The first block becomes a free block through the garbage collection.

The memory controller 200 registers free blocks generated by garbage collection, for example, in a free block pool. In S101, the memory controller 200 selects a target block from one or more blocks registered in the free block pool.

Subsequently, the memory controller 200 causes the memory chip 101 to execute an erase operation to the target block (S102).

After the erase operation, the CPU 203 determines a threshold voltage (Vth) distribution to find the number of erase-error cells (S103).

As one example, the threshold voltage distribution can be obtained by executing distribution read. Distribution read refers to an operation of determining the threshold voltage distribution by counting the number of memory cells in ON state or the number of memory cells in OFF state connected to a word line while shifting a voltage applied to the word line by a given value. A method of determining the threshold voltage distribution is not limited to this example.

All the memory cells of the target block may be selected as a subject of determination of the threshold voltage distribution. Alternatively, a memory cell group as part of the target block may be selected as a subject of determination of the threshold voltage distribution.

The three-dimensional memory cell array 111 as illustrated in FIG. 2 to FIG. 4 is, for example, manufactured as follows. First, a large number of wiring layers 11, 12, and 13 are laminated. Through holes are then formed in the wiring layers 11, 12, and 13 by dry etching, for example, to form the pillar-shaped conductors 14 in the through holes.

It is difficult to form the holes with the same diameter at every depth position. For example, the holes tend to expand or contract in diameter depending on the depth position. As a result, the characteristics of the memory cells may differ at each depth position, that is, the position of the word line.

Erase error may likely occur depending on the position of the word line. In such a case, a memory cell group connected to part of the word lines being likely to cause erase error may be selected as a subject of determination of the threshold voltage distribution.

The threshold voltage distribution illustrated in FIG. 8 or FIG. 9 is determined in S103. After S103, the memory controller 200 counts and records the number of erase-error cells from the determined distribution (S104).

The location where the number of erase-error cells is recorded is optional. The number of erase-error cells may be recorded in the RAM 202, or may be recorded in the NAND memory 100 so as not to be affected by power-off. The number of erase-error cells may be stored in the RAM 202 during the operation of the memory system 1, and may be saved in the NAND memory 100 before power-off.

Subsequently, the memory controller 200 causes the memory chip 101 to execute a program operation to the target block (S105).

In the program operation, the memory controller 200 acquires time (value of measured time) from the timer 207, acquires a temperature (value of detected temperature) from the temperature sensor 206, and records the acquired time and temperature (S106).

The location where the time and temperature are recorded is optional. The location where the time and temperature are recorded may be the same as or different from the location where the number of erase-error cells is recorded.

A series of processes in the program operation is completed in S106.

FIG. 11 is a flowchart illustrating an exemplary series of processes in the read operation in the first embodiment.

First, the memory controller 200 causes the memory chip 101 to execute a read operation to a target block (S201). Multiple threshold voltages for use in S201 are optionally selected. For example, reference values can be selected as the multiple threshold voltages. For another example, among the shift patterns stored in the shift index table 209, values of a given shift pattern, e.g., a shift pattern with index number zero may be selected as the multiple threshold voltages.

The memory controller 200 acquires data read from the memory cell array 111 through the read operation, and causes the FCC 205 to detect and correct error in the data. The memory controller 200 determines whether the ECC 205 succeeds in the error correction (S202). With no error detected, the memory controller 200 determines the error correction as successful.

After determining the error correction as successful (YES in S202), the memory controller 200 completes the series of processes in the read operation.

After failing in the error correction (NO in S202), the memory controller 200 reads the temperature, the time, and the number of erase-error cells recorded in S104 and S106 of FIG. 10 (S203).

The memory controller 200 then acquires time (value of measured time) from the timer 207, and acquires a temperature (value of detected temperature) from the temperature sensor 206 (S204).

The memory controller 200 calculates a data retention time and a crossing temperature from the time and temperature read in S203 and the time and temperature acquired in S204 (S205).

The number of erase-error cells read in S203 and the data retention time and the crossing temperature calculated in S205 serve as the stress values in the first embodiment. The memory controller 200 determines whether any of the stress values, i.e., the data retention time, the crossing temperature, and the number of erase-error cells, exceeds a given threshold (S206).

For example, thresholds are preset for the respective stress values. The memory controller 200 determines whether any of the data retention time, the crossing temperature, and the number of erase-error cells exceeds the corresponding threshold. A threshold setting method for the stress values is optional.

The operation in S206 corresponds to determining whether to acquire shift patterns in the order of indexes or in accordance with the stress values. As an example, upon satisfaction of a condition that any of the stress values, i.e., the data retention time, the crossing temperature, and the number of erase-error cells, exceeds a given threshold, the memory controller 200 determines to acquire the shift patterns in accordance with the stress values. Upon non-satisfaction of the condition, the memory controller 200 determines to acquire the shift patterns in the order of indexes. The condition for determining whether to acquire the shift patterns in the order of indexes or in accordance with the stress value is not limited to this example.

For example, a divergence between the stress value and the determination reference value may be compared with a given threshold. When the divergence is below the threshold, the memory controller 200 may determine to acquire the shift patterns in the order of indexes. When the divergence exceeds the threshold, the memory controller 200 may determine to acquire the shift patterns in accordance with the stress values.

When any of the stress values, i.e., the data retention time, the crossing temperature, and the number of erase-error cells, exceeds the given threshold (YES in S206), the memory controller 200 calculates the divergence between the stress value and the determination reference value for each index, and selects an index associated with a determination reference value having a smallest divergence from the stress value (S207). Then, the memory controller 200 causes the memory chip 101 to execute a read operation to the target block, using the selected shift pattern (S208). The read operation executed in S208 corresponds to a retry read operation.

The memory controller 200 acquires data read from the memory cell array 111 through the retry read operation in S208, and causes the ECC 205 to detect and correct error in the data. As in S202, the memory controller 200 determines whether the ECC 205 succeeds in the error correction (S209).

After determining the error correction (YES in S209) as successful, the memory controller 200 completes the series of processes in the read operation.

After failing in the error correction (NO in S209), the memory controller 200 determines whether to continue the retry read operation (S210).

A method for determining whether to continue the retry read operation is optional. For example, the memory controller 200 may determine whether to continue the retry read operation depending on whether the number of executions of retry read operation reaches a preset upper limit. Alternatively, the memory controller 200 may determine whether to continue the retry read operation depending on whether an elapsed time from execution of S201, for example, reaches a preset upper limit. Alternatively, the memory controller 200 may determine whether to continue the retry read operation depending on whether any shift pattern remains unselected.

After determining to continue the retry read operation (YES in S210), the memory controller 200 re-executes the operation in S207. In S207, the memory controller 200 selects a shift pattern associated with a determination reference value having a smallest divergence from the stress value from among unselected shift patterns. The memory controller 200 then re-executes a retry read operation in S208.

After determining not to continue the retry read operation (NO in S210), the memory controller 200 executes a given process (S211), completing the series of processes in the read operation. The given process executed in S212 may be optionally set. For example, the memory controller 200 may notify the host 2 of failure of error correction.

With none of the stress values, i.e., the data retention time, the crossing temperature, and the number of erase-error cells exceeding the given threshold (NO in S206), the memory controller 200 selects an index recorded in the history information 208 (S212).

When the read operation is successful using the selected shift pattern based on an index, the index is recorded in the history information 208. The index is recorded per given storage area (e.g., per block). That is, the history information 208 stores the index of the shift pattern applied to a previous successful read operation to the target block. In S212, the memory controller 200 reads the index of the shift pattern applied to a successful read operation from the history information 208.

Subsequently, the memory controller 200 causes the memory chip 101 to execute a read operation to the target block using the shift pattern indicated by the selected index (S213). The read operation executed in S213 corresponds to a retry read operation.

The memory controller 200 acquires data read from the memory cell array 111 through the retry read operation in S213, and causes the ECC 205 to detect and correct error in the data. The memory controller 200 determines whether the ECC 205 succeeds in the error correction, as in S202 (S214).

After failing in the error correction (NO in S214), the memory controller 200 determines whether to continue the retry read operation (S215). The determination method in S215 may be the same as or different from that in S210.

After determining to continue the retry read operation (YES in S215), the memory controller 200 selects a next index (S216). Then, the memory controller 200 re-executes the operation in S213. After determining not to continue the retry read operation (NO in S215), the memory controller 200 executes the operation in S211.

After determining the error correction as successful (YES in S214), the memory controller 200 updates the index recorded in the history information 208 to the currently selected index (S217), completing the series of processes in the read operation.

Thus, according to the first embodiment, the memory controller 200 selects one of the recorded shift patterns from the shift index table in accordance with the stress value.

Thereby, it is possible to reduce the number of executions of retry read operation as compared with selecting the shift patterns in the order of indexes. This can shorten the time taken for obtaining error-free data, improving the read performance of the memory system 1.

In addition, in the shift index table 209, part or all of the recorded shift patterns are associated with the determination reference values. The memory controller 200 selects a shift pattern according to the divergence between the stress value and the determination reference value.

This can heighten the possibility for obtaining, through the initial retry read operations, an appropriate shift pattern, that is, a shift pattern enabling data read without a failure of error correction, even at the time of occurrence of a variation in the threshold voltage due to the three events as above.

Further, to deal with a failure of the retry read operation, the memory controller 200 selects, from among the shift patterns excluding previously selected shift patterns, the one associated with the determination reference value having a smallest divergence from the stress value among the previously non-selected shift patterns. Then, the memory controller 200 causes the memory chip 101 to re-execute a retry read operation.

This makes it possible to obtain data containing no error through a smaller number of retry read operations, even at the time of a variation in the threshold voltage due to the three events as above.

In addition, in the shift index table 209, the stored shift patterns are associated with the indexes. Upon satisfaction of the given condition for the stress values, the memory controller 200 causes the first memory to execute a read operation using the shift pattern selected according to the determination reference value. Upon non-satisfaction of the given condition for the stress values, the memory controller 200 causes the first memory to execute a read operation using the shift pattern selected according to the index.

Thereby, the memory controller 200 can determine an appropriate shift-pattern selection method depending on whether the threshold voltage varies due to the above three events.

After failing in the read operation using the shift pattern selected according to the index, the memory controller 200 selects another shift pattern in the order of indexes and causes the memory chip 101 to execute a read operation.

Further, the memory controller 200 causes the memory chip 101 to execute an erase operation, and after the erase operation, counts the number of memory cells whose threshold voltages are not included in the Er-state. The memory controller 200 may use the count of the memory cells whose threshold voltages are not included in the Er-state as the stress value.

During a great variation in the threshold voltage due to the presence of a memory cell in which data erasure is not completed, the memory controller 200 as configured above can decrease the number of executions of retry read operation.

In addition, the memory controller 200 acquires a value of measured time from the timer 207 in the program operation. The memory controller 200 also acquires a value of measured time from the timer 207 in the read operation. Then, the memory controller 200 finds a difference between the value of measured time acquired during the program operation and the value of measured time acquired during the read operation, that is, data retention time, and uses the difference as the stress value.

With occurrence of a great variation in the threshold voltage due to the data retention time, the memory controller 200 as configured above can decrease the number of executions of retry read operation.

In addition, the memory controller 200 acquires a value of the detected temperature from the temperature sensor 206 during the program operation. The memory controller 200 acquires a value of the detected temperature from the temperature sensor 206 during the read operation. Then, the memory controller 200 uses a difference between the value of the detected temperature acquired during the program operation and the value of the detected temperature acquired during the read operation, that is, the crossing temperature, as the stress value.

With occurrence of a great variation in the threshold voltage due to the temperature crossing, the memory controller 200 as configured above can decrease the number of executions of retry read operation.

Second Embodiment

In the first embodiment, the number of erase-error cells is counted as the stress value related to the erase error. The stress value related to the erase error is not limited thereto.

As described above, after a program operation to a block including an erase-error cell, the block exhibits a broader threshold voltage distribution than a block including no erase-error cell.

As a result, through the program operation, a block including an erase-error cell is likely to exhibit a larger number of bit errors (fail bit count: FBC) than the block including no erase-error cell.

Figure 12:
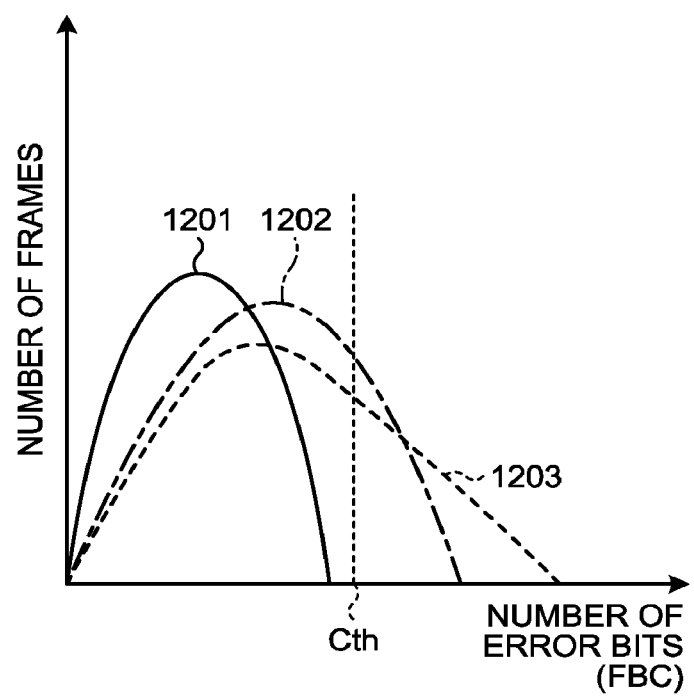
FIG. 12 is a graph illustrating a relationship between frames with different numbers of erase errors and the number of error bits.

FIG. 12 is a diagram illustrating a relationship between frames having different numbers of erase errors and the number of error bits. Herein, a frame represents a data group serving as a unit of error correction.

An error bit distribution is indicated by reference numeral 1201, which is obtained by a program operation to a block including no erase-error cell (referred to as a third block). Another error bit distribution is indicated by reference numeral 1202, which is obtained by a program operation to a block including an erase-error cell (referred to as a fourth block). Still another error bit distribution is indicated by reference numeral 1203, which is obtained by a program operation to a block including a larger number of erase-error cells than the fourth block (referred to as a fifth block).

It can be understood from FIG. 12 that the number of frames including a larger number of bit errors tends to increase along with the number of erase-error cells.

In view of this, in the second embodiment, the number of frames each of which includes bit errors more than a given value (for example, Cth in FIG. 12) is set as the stress value for the erase error. The stress value set as above increases along with the number of erase-error cells.

The following will mainly describe differences from the first embodiment, and repetitive description will be omitted.

In the second embodiment, a shift index table 209a is stored in the RAM 202 instead of the shift index table 209.

FIG. 13 is a schematic diagram illustrating an exemplary data structure of the shift index table 209a in the second embodiment. In the shift index table 209a of the second embodiment, the shift patterns are associated with a determination reference value for the number of frames each of which includes bit errors more than Cth, instead of the determination reference value for the number of erase-error cells.

Figure 14:
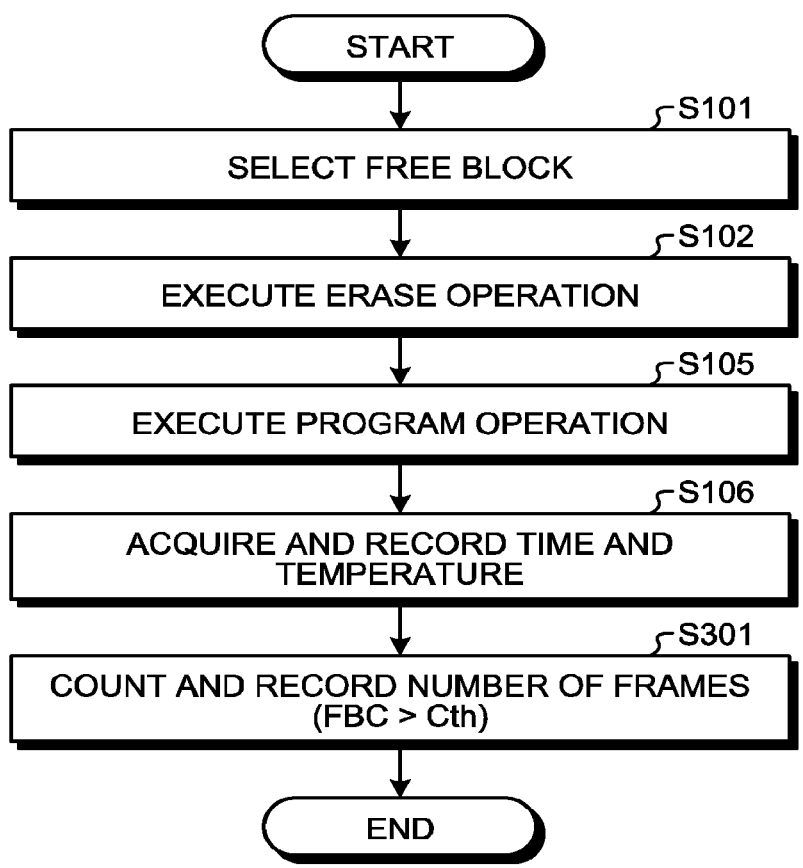
FIG. 14 is a flowchart illustrating an exemplary series of processes in program operation in the second embodiment.
Figure 15:
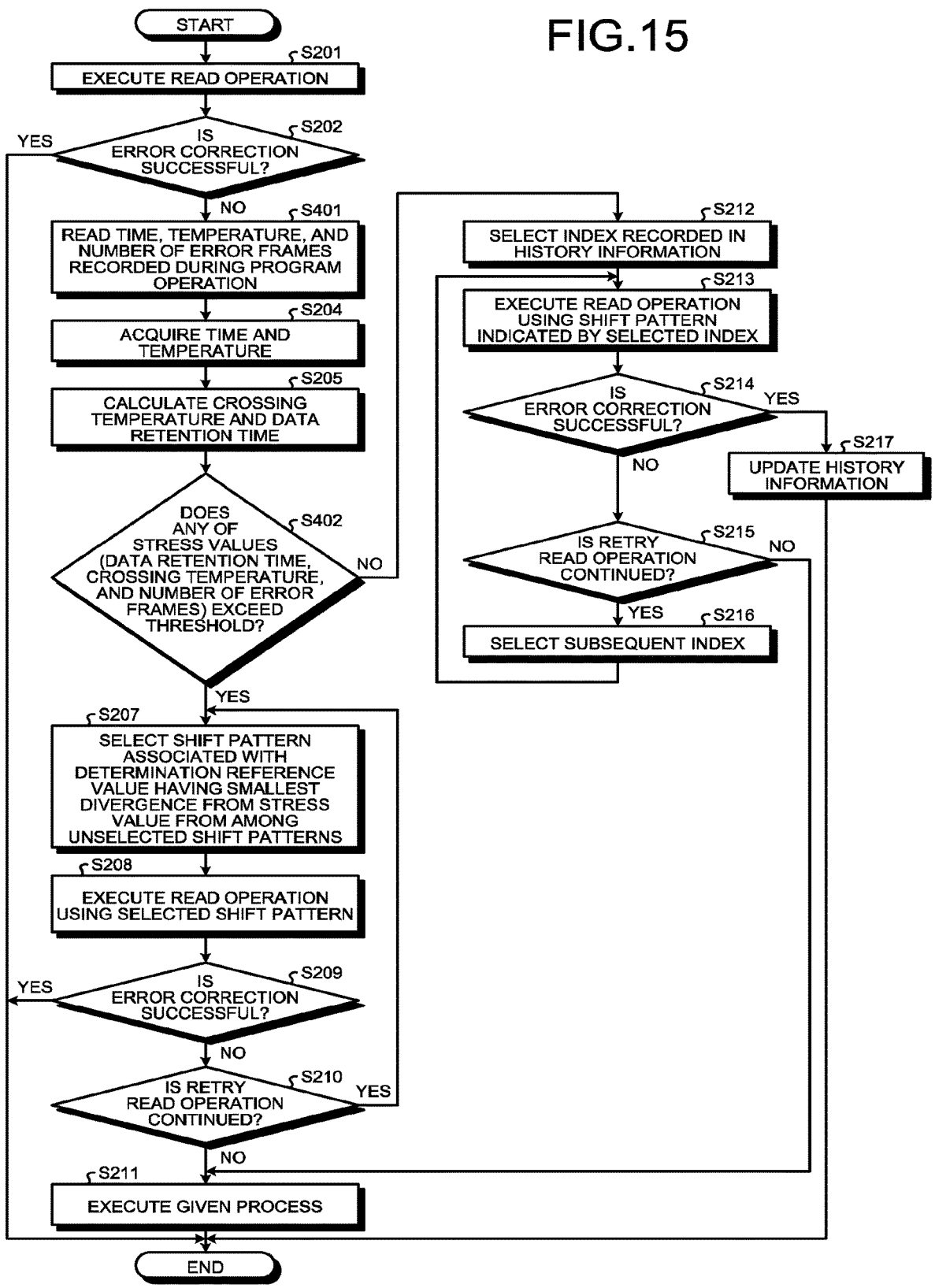
FIG. 15 is a flowchart illustrating an exemplary series of processes in read operation in the second embodiment.

FIG. 14 is a flowchart illustrating an exemplary series of processes in program operation in the second embodiment. In the flowcharts of FIGS. 14 and 15, the same processes as in the first embodiment are denoted by the same step numbers, and a description thereof will be brief or omitted.

First, the memory controller 200 selects a free block (S101). The selected free block is referred to as a target block.

Subsequently, the memory controller 200 causes the memory chip 101 to execute an erase operation to the target block (S102).

The memory controller 200 causes the memory chip 101 to execute a program operation to the target block (S105).

In the program operation, the memory controller 200 acquires time (value of measured time) from the timer 207, acquires a temperature (value of detected temperature) from the temperature sensor 206, and records the acquired time and temperature (S106).

The location where the time and temperature are recorded is optional. The time or temperature may be recorded in the RAM 202, for example, or may be recorded in the HAND memory 100 so as not to be lost by power-off. The time or the temperature may be stored in the RAM 202 during the operation of the memory system 1, and may be saved in the NAND memory 100 before power-off.

Subsequently, the memory controller 200 counts and records the number of frames each of which includes bit errors more than Cth (S301).

In S301, for example, the memory controller 200 causes the memory chip 101 to execute a read operation to the target block. In the read operation, the multiple threshold voltages are optionally selected for use. For example, reference values may be selected as the multiple threshold voltages. For another example, among the shift patterns recorded in the shift index table 209, values of a given shift pattern, e.g., the shift pattern with index number zero may be selected as the multiple threshold voltages.

Then, the memory controller 200 compares data read at a read voltage with an expected value of the data, i.e., correct data, to thereby acquire the number of bit errors in each frame. The memory controller 200 counts the number of frames each of which includes bit errors more than Cth, on the basis of the acquired number of bit errors in each frame. The memory controller 200 counts, as the number of bit errors, errors in read data with respect to the expected value of the data. The expected value of data may be written data saved in advance or corrected data through error correction. When the number of bit errors in a frame is sufficiently smaller than Cth, counting the number of frames may be omitted. Hereinafter, the number of frames each of which includes bit errors more than Cth is referred to as the number of error frames. Note that the number of error frames does not always represent the number of frames having failed in error correction.

The number of error frames obtained as above is recorded in any location. The number of error frames may be recorded in the RAM 202 or may be recorded in the NAND memory 100 so as not to be lost by power-off, for example. The number of error frames may be recorded in the RAM 202 during the operation of the memory system 1, and may be saved in the NAND memory 100 before power-off.

The memory controller 200 completes a series of processes in the program operation in S301.

FIG. 15 is a flowchart illustrating an exemplary series of processes in a read operation in the second embodiment. The flowchart includes operations S401 and S402, in place of S203 and S206 of the read operation in the first embodiment illustrated in FIG. 11.

In S401, the memory controller 200 reads the temperature, the time, and the number of error frames recorded in S106 and S301 of FIG. 14 (S401).

In S402, the memory controller 200 determines whether any of the stress values of the second embodiment, i.e., the data retention time, the crossing temperature, and the number of error frames, exceeds a given threshold (S402).

For example, thresholds are preset for the respective stress values. The memory controller 200 determines whether any of the data retention time, the crossing temperature, and the number of error frames exceeds the corresponding threshold. A method for setting the threshold for each stress value is optional.

The operation in S402 corresponds to determining whether to acquire the shift patterns in the order of indexes or on the basis of the stress values. As an example, upon satisfaction of a condition that any of the stress values, i.e., the data retention time, the crossing temperature, and the number of error frames, exceeds a given threshold, the memory controller 200 determines to acquire the shift patterns on the basis of the stress values. Upon non-satisfaction of the condition, the memory controller 200 determines to acquire the shift patterns in the order of indexes. As in S206 of the first embodiment, the condition for determining whether to acquire the shift patterns in the order of indexes or on the basis of the stress values is not limited to this example.

With any of the stress values, i.e., the data retention time, the crossing temperature, and the number of error frames exceeding the given threshold (YES in S402), the memory controller 200 executes the operation in S207. With none of the stress values, i.e., the data retention time, the crossing temperature, and the number of error frames exceeding the given threshold (NO in S402), the memory controller 200 executes the operation in S212.

The second embodiment has described the example that the number of bit errors is counted on a frame basis to set the number of frames each of which includes bit errors more than Cth as the stress value related to the erase error. However, a storage area as a unit of counting the number of bit errors is not limited to a frame. The unit for counting the number of bit errors may be, for example, a chip, a block, a string unit, a word line, or a page.

As described above, according to the second embodiment, the memory controller 200 counts the number of bit errors in each storage area after a program operation, and sets the number of storage areas each of which includes bit errors more than a given value as a stress value.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a first memory being nonvolatile, the first memory including a plurality of memory cell transistors, each of the plurality of memory cell transistors configured to store data corresponding to a threshold voltage thereof;
a second memory configured to store a plurality of candidate values for a read voltage, each of the plurality of candidate values being associated with a determination reference value of a degree of stress that affects the threshold voltage; and
a memory controller configured to:
cause the first memory to execute a read operation to acquire data corresponding to the threshold voltage from the plurality of memory cell transistors on the basis of a result of comparison between the threshold voltage and a read voltage, wherein
the memory controller is further configured to:
determine the degree of stress of the plurality of memory cell transistors;
select a first candidate value from among the plurality of candidate values;
cause the first memory to execute the read operation using the first candidate value as the read voltage; and
in a case that the read operation using the first candidate value has failed,
calculate a first divergence, the first divergence being a divergence between the determined degree of stress and the determination reference value of the degree of stress that is associated with the first candidate value; and
in a case that the first divergence is larger than a first threshold,
select a second candidate value from among the plurality of candidate values, a divergence between the determined degree of stress and the determination reference value of the degree of stress that is associated with the second candidate value is smallest among divergences between the determined degree of stress and the determination reference value of the degree of stress that are respectively associated with unselected candidate values of the plurality of candidate values; and
cause the first memory to execute the read operation using the second candidate value as the read voltage.

2. The memory system according to claim 1, wherein the plurality of candidate values are each associated with an index from among indexes, and
the memory controller is further configured to:
cause, upon satisfaction of a first condition for the degree of stress, the first memory to execute the read operation using the first candidate value as the read voltage, and
select, upon non-satisfaction of the first condition for the degree of stress, a second candidate value from among the plurality of candidate values in accordance with the index, and cause the first memory to execute the read operation using the second candidate value as the read voltage.

3. The memory system according to claim 2, wherein the memory controller is further configured to:
after the read operation using the second candidate value is failed,
select a third candidate value in the order of the indexes from among the plurality of candidate values, and cause the first memory to execute the read operation using the third candidate value as the read voltage.

4. The memory system according to claim 1, wherein the memory controller is further configured to:
cause the first memory to execute an erase operation,
count the number of memory cell transistors each having erase error among the plurality of memory cell transistors after the erase operation, and
use the counted number as the degree of stress.

5. The memory system according to claim 1, wherein the first memory includes a plurality of storage areas, and
the memory controller is further configured to:
cause the first memory to execute an erase operation,
cause the first memory to execute a program operation after the erase operation,
count the number of bit errors in each of the storage areas after the program operation, and
use, as the degree of stress, the number of storage areas each of which includes bit errors more than a first value.

6. The memory system according to claim 1, further comprising
a timer configured to measure time, wherein
the memory controller is further configured to:
cause the first memory to execute a program operation,
acquire a first value from the timer in the program operation,
acquire a second value from the timer when causing the first memory to execute the read operation, and
use a difference between the first value and the second value as the degree of stress.

7. The memory system according to claim 1, further comprising
a temperature sensor configured to detect a temperature, wherein
the memory controller is further configured to:
cause the first memory to execute a program operation,
acquire a first value from the temperature sensor in the program operation,
acquire a second value from the temperature sensor when causing the first memory to execute the read operation, and
use a difference between the first value and the second value as the degree of stress.

8. A method of controlling a memory system, the memory system including a first memory being nonvolatile, the first memory including a plurality of memory cell transistors, each of the plurality of memory cell transistors configured to store data corresponding to a threshold voltage, and a second memory configured to store a plurality of candidate values for a read voltage, each of the plurality of candidate values being associated with a determination reference value of a degree of stress that affects the threshold voltage; the method comprising:
causing the first memory to execute a read operation for acquiring data corresponding to the threshold voltage from the plurality of memory cell transistors on the basis of a result of comparison between the threshold voltage and a read voltage;

determining the degree of stress of the plurality of memory cell transistors;

selecting a first candidate value from among the plurality of candidate values for the read voltage in accordance with a degree of stress that affects the threshold voltage; and causing the first memory to execute the read operation, using the first candidate value as the read voltage; and in a case that the read operation using the first candidate value has failed, calculate a first divergence, the first divergence being a divergence between the determined degree of stress and the determination reference value of the degree of stress that is associated with the first candidate value; and in a case that the first divergence is larger than a first threshold, select a second candidate value from among the plurality of candidate values a divergence between the determined degree of stress and the determination reference value of the degree of stress that is associated with the second candidate value is smallest among divergences between the determined degree of stress and the determination reference value of the degree of stress that are respectively associated with unselected candidate values of the plurality of candidate values; and cause the first memory to execute the read operation using the second candidate value as the read voltage.

9. The method according to claim 8, wherein the plurality of candidate values are each associated with an index from among indexes, the method further comprising:

upon satisfaction of a first condition for the degree of stress, causing the first memory to execute the read operation using the first candidate value as the read voltage, and upon non-satisfaction of the first condition for the degree of stress, selecting a second candidate value from among the plurality of candidate values in accordance with the index, and causing the first memory to execute the read operation using the second candidate value as the read voltage.

10. The method according to claim 9, further comprising after the read operation using the second candidate value is failed, selecting a third candidate value in the order of indexes from among the plurality of candidate values, and causing the first memory to execute the read operation using the third candidate value as the read voltage.

11. The method according to claim 8, further comprising:

causing the first memory to execute an erase operation;

counting the number of memory cell transistors each having erase error among the plurality of memory cell transistors after the erase operation; and using the counted number as the degree of stress.

12. The method according to claim 8, wherein the first memory includes a plurality of storage areas, the method further comprising:

causing the first memory to execute an erase operation;

causing the first memory to execute a program operation after the erase operation;

counting the number of bit errors in each of the storage areas after the program operation; and using, as the degree of stress, the number of storage areas each of which includes bit errors more than a first value.

13. The method according to claim 8, wherein the memory system further comprises a timer configured to measure time, the method further comprising:

causing the first memory to execute a program operation;

acquiring a first value from the timer in the program operation;

acquiring a second value from the timer when causing the first memory to execute the read operation; and using a difference between the first value and the second value as the degree of stress.

14. The method according to claim 8, wherein the memory system further comprises a temperature sensor configured to detect a temperature, the method further comprising:

causing the first memory to execute a program operation;

acquiring a first value from the temperature sensor in the program operation;

acquiring a second value from the temperature sensor when causing the first memory to execute the read operation; and using a difference between the first value and the second value as the degree of stress.

\* \* \* \* \*